(12) United States Patent
Anderson (10) Patent No.: US 6,307,363 B1
(45) Date of Patent: Oct. 23, 2001

(54) ULTRAHIGH-FREQUENCY HIGH-IMPEDANCE PASSIVE VOLTAGE PROBE

(76) Inventor: Bruce Michael Anderson, 2402 W. Kathleen Rd., Phoenix, AZ (US) 85023

( * ) Notice: Subject to any disclaimer, the term of this patent is extended or adjusted under 35 U.S.C. 154(b) by 0 days.

(21) Appl. No.: 09/102,220

(22) Filed: Jun. 22, 1998

(51) Int. Cl.[7] ............................. G01R 31/02; G01R 1/06

(52) U.S. Cl. ......................................... 324/72.5; 324/149

(58) Field of Search ................................ 324/72.5, 754, 324/645, 538, 758, 149

(56) References Cited

U.S. PATENT DOCUMENTS

| | | | |
|---|---|---|---|
| 2,883,619 | 4/1959 | Kobbe | 324/72.5 |
| 3,412,327 | 11/1968 | Murray | 324/72.5 |
| 3,532,982 | 10/1970 | Zeidlhack | 324/121 |
| 4,418,314 | 11/1983 | Nieto | 324/72.5 |
| 4,978,907 | 12/1990 | Smith | 324/72.5 |
| 5,107,201 | 4/1992 | Ogle | 324/72.5 |
| 5,172,051 | 12/1992 | Zamborelli | 324/72.5 |
| 5,512,838 | * 4/1996 | Roach | 324/754 |
| 5,903,143 | * 5/1999 | Mochizuki et al. | 324/72.5 |

* cited by examiner

Primary Examiner—Safet Metjahic
Assistant Examiner—J Kerveros (57) ABSTRACT

The most commonly used type of voltage probe for high-bandwidth applications is the high-impedance passive probe. It is reliable, rugged, simple to use, and inexpensive. However, because it has a relatively high input capacitance, it is not truly "high impedance" to the higher frequency components of a test signal. Consequently, connecting the probe can distort the signal under test (e.g., by increasing the rise and fall times of a fast pulse). Also, the probe input capacitance forms a resonant circuit with any parasitic inductance in the probe ground lead. In response to a short-duration step in voltage, this can cause spurious oscillations in the input signal to the instrument. Active probes generally have a much lower input capacitance, thereby minimizing these problems. Also, active probes have been able to achieve much higher bandwidths than those of high-impedance passive probes. But active probes are very expensive, and they are not as rugged or as reliable as passive probes. They also require a power source, and they can introduce a DC offset error to the measured signal. The present invention is for circuitry that greatly increases the bandwidth of high-impedance passive probes. The invention employs a plurality of separate circuit paths for the AC components of a test signal to bypass the attenuating resistor at the probe tip. This circuitry also increases the input impedance for the higher frequency components of a test signal. Thus the invention allows the design of high-impedance passive probes that are competitive in performance with active probes while retaining the much lower cost, and the other inherent advantages, of passive probes. Also disclosed, are voltage probes with selectable attenuation factors of specific values that combine user convenience with relatively high bandwidth.

20 Claims, 2 Drawing Sheets

ULTRAHIGH-FREQUENCY HIGH-IMPEDANCE PASSIVE VOLTAGE PROBE

CROSS-REFERENCE TO RELATED APPLICATIONS

Not Applicable

STATEMENT REGARDING FEDERALLY SPONSORED RESEARCH AND DEVELOPMENT

Not Applicable

REFERENCE TO A MICROFICHE APPENDIX

Not Applicable

BACKGROUND OF THE INVENTION

This invention relates generally to instrumentation used in the testing and measuring of electrical signals. More specifically, it relates to a high-impedance passive voltage probe for making the electrical connection between a signal under test and the input of an oscilloscope, logic analyzer, spectrum analyzer, or other type of wideband test equipment.

The ideal voltage probe would have an unlimited bandwidth and would not alter the signal being tested. It would be perfectly accurate, completely reliable, easy to use, and inexpensive. Needless to say, such an ideal voltage probe does not exist. The design of a practical voltage probe requires that compromises be made among the various probe attributes according to their relative importance. For a given measurement situation, a user must select a probe according to the measurement objective, the characteristics of the circuit under test, and the characteristics of the probe.

Wide bandwidth voltage probes can be categorized into three general types; namely: low-impedance passive probes, active probes, and high-impedance passive probes. Each of these types has a different set of inherent advantages and disadvantages.

The simplest type of probe for high-bandwidth signals is the low-impedance, or low-Z, probe. This type of probe employs a 50 ohm coaxial cable that is connected to a 50 ohm input of the test instrument. A series resistor is often used in the probe tip in order to minimize the effect of the probe on the test signal. This causes an attenuation of the test signal by the voltage divider that is formed by the tip resistor and the 50 ohm input of the test instrument. For example, a 10X probe (i.e., a probe with an attenuation factor of 10:1) would utilize a resistor of 450 ohms in the probe tip.

The low-impedance passive probe type is rugged, reliable, and relatively inexpensive. It is also capable of very high bandwidth (well into the GHz range). The only drawback of this probe type is the significant load that it introduces to the circuit under test. The load for a 10X probe is equivalent to a 500 ohm resistor to ground. This load can significantly alter the test signal, perhaps enough to cause a malfunction in the circuit being tested. consequently, the low-impedance probe type is normally used only when a very high bandwidth is required and only for circuits that can tolerate the significant resistive load of these probes.

By incorporating an amplifier circuit within the probe tip, the active probo type provides a much higher input impedance than that of the low-impedance probe type. This impedance comprises a relatively high resistance that is in parallel with a small capacitance. Because of this capacitance, which may be on the order of 1 pF, the load impedance of the active probe is frequency dependent—being lower for the higher frequency components of a test signal. Although the bandwidth capability of the active probe type is not as high as for the low-impedance probe type, it can extend well into the GHz frequency range.

A major disadvantage of the active probe type is that it is very expensive relative to either the low-impedance or high-impedance passive types. It is also less reliable and less rugged than these other types, and it requires that power be supplied to the probe. It can also introduce a DC offset error in the measured signal.

The most commonly used type of wide bandwidth voltage probe is the high-impedance passive probe. This probe type is rugged, reliable, simple to use, and inexpensive. For relatively low-frequency signals, including DC, these probes can present a very high-impedance load to the circuit under test. However, they have a significantly higher capacitive loading than the active probe type, and are not truly "high impedance" for the higher frequency components of a test signal. Therefore, connecting this probe to a test signal can attenuate the higher frequency components of the signal, thereby distorting the signal under test. For example, a signal comprising a pulse with very short-duration rise and fall times would have these times increased by the connection of the voltage probe. The relatively high input capacitance of this probe type can also impede the measurement of fast pulses by introducing spurious oscillations in the signal presented to the input of the instrument. This can occur because the input capacitance at the probe tip forms a resonant circuit with any parasitic inductance in the probe ground lead. A lower input capacitance, as is generally the case for active probes, minimizes this effect by increasing the resonant frequency, thereby making reliable measurements less sensitive to the length of the probe ground connection. Another significant disadvantage of the high-impedance probe type is that the maximum bandwidth for these probes is lower than that of the active probe type. For example, the bandwidth for a 10X high-impedance passive probe that has an acceptably low level of signal aberrations has heretofore been limited to about 500 MHz.

The disadvantages of the high-impedance passive probe type are related to the relatively low input impedance of this probe for the higher frequency components of a test signal. A high-impedance passive probe without this disadvantage would be highly desirable. Such a probe would be more competitive with active probes in regard to bandwidth and input impedance while maintaining all of the advantages associated with passive probes; such as: low cost, high reliability, and ease of use. Such a probe requires a different design approach than has been used in the prior art.

Oscilloscopes and other test instruments that are designed for use with high-impedance passive probes incorporate high-impedance inputs for making connections to these probes. The standardized high-impedance input consists of a 1 megohm resistance to ground with a parallel capacitance. The parallel input capacitance generally falls within the range of about 6 to 35 pF, with higher bandwidth instruments having an input capacitance near the lower end of this range. High-bandwidth probes incorporate a series resistance in the probe tip that attenuates the signal under test by means of the resistive voltage divider that is formed with the 1 megohm input resistance in the instrument. A 10X probe, which attenuates the signal by a factor of 10:1, requires a tip resistance of 9 megohms.

In order to achieve a high bandwidth, the tip resistance must be bypassed by a parallel tip capacitance. Otherwise, higher frequency components of a test signal would be greatly attenuated by the total capacitance at the input of the instrument. This total capacitance to ground at the instrument includes not only the input. capacitance within the test instrument, but also the distributed capacitance between the signal line and the ground return line in the probe cable. Some probes also have discrete capacitance between the signal and ground return lines, and this is also included in the total input capacitance. The total input capacitance, in concert with the tip bypass capacitance, comprises a capacitive voltage divider for the AC components of a test signal. This voltage divider must have the same attenuation factor for AC as does the resistive divider for DC. For a 10X probe, this requires that the value of the tip bypass capacitance be equal to one ninth of the value of the total input capacitance at the instrument. For some voltage probes, the tip bypass capacitance employs a variable, capacitor so that the user can adjust the frequency compensation by matching the attenuation of the capacitive voltage divider to that of the resistive voltage divider. Other probes may include a variable capacitor at the instrument end of the probe assembly in order to provide for this adjustment.

Even with the inclusion of the tip bypass capacitor, the probe just described would only be suitable for higher bandwidths if the length of the probe cable is kept very short. Otherwise, the cable behaves as a transmission line, rather than as a lumped capacitance. The problem that results from this can perhaps be best understood by considering the response of the probe to a step function.

The initial response of the probe to a step input is governed by the tip capacitance, the transmission line cable, and the capacitance at the instrument input. The tip resistor and the resistance to ground within the instrument can be ignored. A step input introduces a very narrow voltage spike at the tip end of the transmission line cable. The rise time of this spike is the same as that of the stop input—with zero rise time for an ideal step function from a source having zero impedance. The fall time is an exponential decay having a time constant given by the value of the tip capacitance multiplied by the sum of the characteristic impedance of the transmission line plus any source resistance.

For a 1 volt step input, a 10X probe must be charged to a value of 0.1 volts. However, the initial voltage spike travels down the transmission line without charging the line itself. Instead, the charge associated with this voltage spike is delivered to the instrument end of the probe. This overcharges the input capacitance at the instrument to a much higher voltage than the desired 0.1 volt step. Since the cable is not terminated in its characteristic impedance, a reflection occurs from this incident signal. Also, the overcharged input capacitor subsequently discharges back into the transmission line, which eventually lowers the input voltage to a value less than the desired 0.1 volts. A series of reflections occurs from both ends of the transmission line that results in a damped oscillation at the instrument input that eventually settles to the correct DC voltage level of 0.1 volts. Thus the input signal to the instrument does not accurately replicate the input stop function.

The most common solution to this transmission line problem in the prior art is to use a resistive conductor for the signal line of the transmission line cable (see U.S. Pat. No. 2,883,619, Kobbe, et al.). one effect of such a lossy transmission line is to attenuate the initial voltage spike as it travels down the line so that it does not appreciably overcharge the input capacitance. After the initial charge, the input will still exhibit damped oscillations about the final value. However, the amplitude and the time duration of these signal aberrations can be limited to an acceptable level.

Another solution to the problem is to add a resistor in series with the bypass capacitor at the probe tip (see U.S. Pat. Nos. 4,978,907, Smith, and 5,172,051, Zamborelli). This can limit the amplitude extend and the time duration of the initial voltage spike. Although this approach can limit the signal aberrations at the instrument input, it also increases the rise time of the initial step at the instrument input, thereby reducing probe bandwidth.

BRIEF SUMMARY OF THE INVENTION

An object of the present invention is to increase the bandwidth of high-impedance passive voltage probes. Another object of the invention is to reduce signal aberrations in the input to the test instrument. A further object of the invention is to increase the probe input impedance to higher frequency components of a test signal. A higher input impedance minimizes any distortion in the test signal that may result from connecting the probe, and it also serves to minimize spurious oscillations that can result from the parasitic inductance in the probe ground return connection.

The present invention solves the transmission line problem by using a plurality of separate circuit paths for the AC components of a test signal to bypass the tip resistor. Each of these bypass paths must block any DC component of the test signal. This is generally achieved by incorporating at least one series capacitive element in each of these bypass paths. The total effective capacitance for all of these bypass paths must be equivalent in value to the single bypass capacitor in the previously described probe circuit. An example implementation of the invention would be a probe that has two parallel bypass paths with one of these consisting of a single capacitor and the other consisting of a capacitor, a resistor, and an inductor, all in series. Then, for a 10X probe, the sum of the values of these two bypass capacitors must be equal to one ninth the value of the total capacitance at the instrument input (where this total input capacitance includes that of the probe cable).

In response to an input stop function, the bypass path comprising the single capacitor contributes a very short-duration voltage spike to the tip end of the transmission line cable. The bypass path with the series inductor contributes a lower amplitude voltage pulse that has significantly longer rise and fall times. The amplitude and timing of this pulse are dependent on the values selected for the series inductor and resistor in that circuit path. The short-duration voltage spike delivers the initial charge to the input capacitance at the instrument. The magnitude of this charge is determined by the value of the capacitance in the bypass path comprising the single capacitor. The value of this capacitor is selected to produce a slight overshoot in the initial voltage step at the instrument input. This value represents only a fraction of the total bypass capacitance. In comparison to the prior art, this relatively small capacitance has the beneficial affect of lowering the time constant for the falling edge of the initial voltage spike. This decreases the signal rise time at the instrument input,, thereby significantly increasing the bandwidth of the probe. The relatively small value of this capacitor also has the beneficial effect of increasing the input impedance of the probe for the higher frequency components of a test signal.

After the short-duration voltage spike has charged the input capacitance to slightly over the required step in voltage, the input capacitance discharges back into the transmission line cable until the voltage drops to slightly below the required value. The arrival of the voltage pulse from the tip bypass path that includes the inductive element then recharges the input capacitance to a voltage slightly greater than the required value. Then the input capacitance again discharges back into the transmission line until it is again recharged by the first reflection from the tip end. Multiple reflections from both ends of the transmission line then contribute to a damped oscillation that settles to the correct voltage level.

The voltage pulse from the bypass path employing the inductor, recharges the input capacitance at the instrument between the time of its initial charge and the arrival time of the first reflection from the tip end. This limits the magnitude of the voltage drop that occurs before the arrival of the first reflection. Thus the use of two separate bypass paths reduces the amplitude of the signal aberrations that follow the initial charging of the input capacitance. These signal aberrations can be reduced further by other modifications to the circuit. Such modifications include, but are not limited to: the inclusion of one or more additional circuit paths for the AC components of a test signal to bypass the tip resistor; the inclusion of a filter at the tip end of the transmission line cable that consists of a series resistor and capacitor between the signal and return lines; and the inclusion of a resistor in series with the transmission line cable at the instrument end of the cable (e.g., a resistor value equal to the characteristic impedance of the transmission line prevents reflections of the very highest frequency components from the instrument end of the cable). The invention can reduce signal aberrations to an acceptable level without resorting to the use of a resistive signal line in the transmission line cable.

Thus the invention has been shown to extend probe bandwidth, minimize signal aberrations, and increase the probe input impedance to higher frequency components of a test signal. The higher input impedance minimizes any distortion in the test signal that may result from connecting the probe, and it also serves to minimize spurious oscillations that can result from the parasitic inductance in the probe ground return connection. The invention makes possible a passive probe that is more competitive with active probes in regard to bandwidth and input impedance while maintaining all of the advantages associated with passive probes; such as: low cost, high reliability, and ease of use. Further objects and advantages of the invention will become apparent to those skilled in the art after examining the detailed description of the invention.

Also disclosed in the following detailed description, is a voltage probe that employs multiple attenuation factors. Probe bandwidth can be enhanced by the use of relatively high levels of attenuation. By combining certain specific attenuation levels together in a given probe, this enhanced probe bandwidth can be realized without sacrificing user convenience.

DETAILED DESCRIPTION OF THE INVENTION

Figure 1:
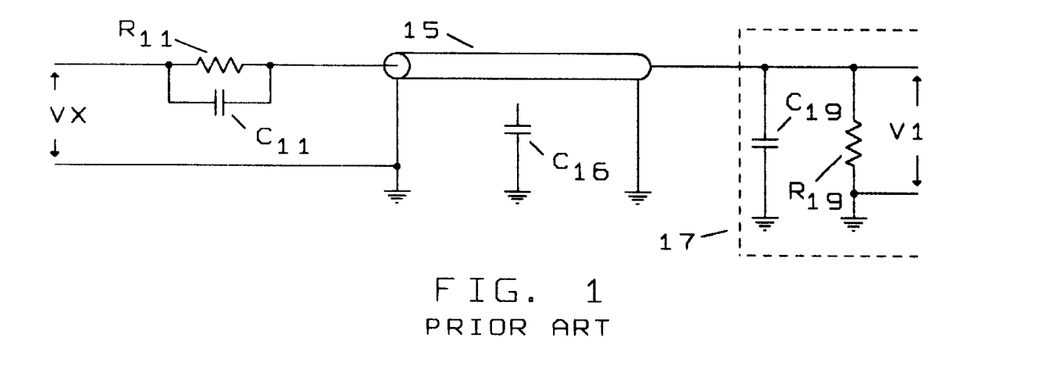
FIG. 1 is a circuit diagram showing the essential elements of a prior-art high-impedance voltage probe connected to a test instrument.

FIG. 1 shows a schematic of the essential elements of a prior-art high-impedance passive voltage probe that is connected to the input of an instrument 17. The standardized input impedance of the instrument comprises a 1 megohm resistance $R_{19}$ in parallel with a small input capacitance $C_{19}$. The input capacitance $C_{19}$ generally ranges from about 6 pF to 35 pF, with higher bandwidth instruments having a value near the lower end of this range. Ideally, the input voltage V1 presented to the instrument should be an attenuated replica of the signal being tested VX. The tip portion of the probe incorporates a passive circuit network in series with the test signal and the tip end of the transmission line cable 15, where this circuit network comprises a tip resistor $R_{11}$ and a parallel bypass capacitor $C_{11}$. The tip resistor $R_{11}$ and the input resistance in the instrument $R_{19}$ form a voltage divider that attenuates the signal under test VX. For a 10X probe, which has an attenuation factor of 10:1, the tip resistor $R_{11}$ must have a value of 9 megohms.

For lower frequency AC components of a test signal, the transmission line cable can be modeled as a lumped capacitor. To this end, the distributed capacitance of the transmission line cable is represented in the schematic as a discrete capacitance $C_{16}$. To maximize probe bandwidth, the tip resistor $R_{11}$ must be bypassed by a tip capacitor $C_{11}$. For AC components of a test signal, this capacitor $C_{11}$ forms a capacitive voltage divider with the total capacitance at the instrument input. This total capacitance includes not only the input capacitance within the instrument $C_{19}$, but also the capacitance of the transmission line cable $C_{16}$. This capacitive voltage divider must provide the same attenuation factor for AC components of the test signal VX as the resistive divider provides for DC. For a 10X probe, this requires that the value of $C_{11}$ must be one ninth of the sum of $C_{19}$ and $C_{16}$.

In response to a high-bandwidth signal, the probe cable 15 (unless it is of very short length) behaves as a transmission line rather than as a lumped capacitance. This can be appreciated by considering the response of the probe to a step function. If the test signal VX is a unit step function—a 1 volt step having zero rise time-the initial voltage at the tip end of the transmission line cable (before any reflections) is given by:

$$V(t) = e^{-t/Z_0 C_{11}},$$

where $Z_0$ is the characteristic impedance of the transmission line cable 15. This voltage spike has a magnitude of one volt, a rise time of zero, and an exponential fall time governed by the time constant $Z_0 C_{11}$. It travels down the transmission line cable where it then provides the initial charge to the input capacitance $c_{19}$ of the instrument 17. If time, t, is now redefined to begin when this voltage spike is first incident at the instrument input, the initial response at the input can be given as:

$$V1(t) = \frac{2C_{11}}{C_{19} - C_{11}} [e^{-t/Z_0 C_{19}} - e^{-t/Z_0 C_{11}}].$$

The above function, a double exponential, defines a positive pulse. Generally, for probes having an attenuation of 10X or higher, the value of $C_{19}$ is greater than the value of $C_{11}$. If $C_{19}$ is significantly greater than $C_{11}$, the rise time of V1(t) it determined primarily by the time constant $Z_0 C_{11}$, and the fall time, which is significantly greater than the rise time, is determined primarily by the time constant $Z_0 C_{19}$. Thus the magnitude of the tip, capacitor $C_{11}$ imposes a lower limit on the rise time of V1(t), and this determines the maximum bandwidth of the probe. Ideally, V1(t) should be an attenuated replica of VX(t), which was assumed to be a, unit step function. Initially (ie., for small values of t), V1(t)

does correspond to a step function that has a finite rise time governed by the time constant $Z_0C_{11}$. However, the amplitude of this step in voltage is initially greater than the required value and then it drops below the required value as the input capacitance $C_{19}$ discharges back into the transmission line with the time constant $Z_0C_{11}$. However, because neither end of the transmission line cable is terminated in the characteristic impedance of the line, reflections occur from both ends of the line. After V1(t) drops below the required value, the arrival of the first reflection at the instrument end of the line recharges the input capacitance $C_{19}$, and this again increases the input voltage V1(t) beyond the required value. Multiple reflections cause V1(t) to have damped oscillations that finally settle to the required voltage.

In the prior art, the most common technique for minimizing the magnitude and duration of these damped oscillations is to employ a. resistive conductor for the signal line of the probe cable. The amplitude of the initial voltage spike is then attenuated as it travels down the transmission line, and this reduces the initial voltage of V1(t). This use of a lossy transmission line can reduce the signal aberrations to an acceptable level. However, the bandwidth of the probe remains bounded by the required size of the tip capacitor $C_{11}$.

It is instructive to consider the steady-state solution to the circuit of FIG. 1 relative to the capacitive voltage divider. For example, consider the case with $R_{11}$ and $R_{19}$ removed from the circuit and no initial charge on the capacitors. For a 10X probe, the steady-state response to a one volt step at VX is to charge capacitor $C_{11}$ to 0.9 volts. This same amount of charge allocated between $C_{19}$ and the distributed capacitance of the transmission line results in an input voltage V1 of 0.1 volts. However, immediately following the fall time of the initial voltage spike at the tip end of the transmission line, $C_{11}$ is charged to a voltage of 1.0 volts. Thus the initial charge entering the transmission line is slightly greater than the final steady-state charge. Moreover, rather than charging the distributed capacitance of the transmission line, all of this charge travels down the line via the initial voltage spike to the instrument end of the transmission line. This causes $C_{19}$ to be initially overcharged to a voltage much higher than the required value of 0.1 volts.

Now consider an ideal response at the tip end of the transmission line when VX(t) is a unit step function. The initial voltage spike should have a very short-duration fall time in order that the initial rise time of V1(t) will also be of very short duration. This serves to maximize the probe bandwidth. Also, the initial voltage spike should deliver only enough charge so that the initial step in voltage at the instrument input V1(t) has just a slight overshoot. The initial voltage spike at the tip end of the line should be accompanied by a relatively low-amplitude pulse that has a time duration of about twice the one-way delay of the transmission line. This pulse serves to charge the distributed capacitance of the transmission line. It also maintains the voltage on $C_{19}$, which would otherwise discharge back into the transmission line. The ideal amplitude for this pulse is one half of the required steady-state voltage on the line. Thus for a 10X probe, the amplitude of the pulse should be about 0.05 volts. Then, as this pulse travels in the forward direction along with the initial voltage spike, the distributed capacitance of the line is left charged to a voltage of 0.05 volts. Because the termination at the instrument end of the line is a very high impedance to DC and to lower frequencies, this incident pulse will maintain a voltage of 0.1 volts on capacitor $C_{19}$ and it will generate a reflected pulse from the instrument end of the line having about the same 0.05 volts amplitude. This reflection then travels back toward the tip end of the line leaving the distributed capacitance of the line charged to about 0.1 volts, which is the required steady-state voltage of the line. Ideally, the fall time of the initial pulse at the tip end should occur at the same time that the reflected pulse arrives at the tip end. The tip end is also terminated in a high impedance to DC and lower frequencies. Therefore, this incident reflection is itself reflected from the tip end of the line, thereby achieving the steady state solution to the probe response.

Figure 2:
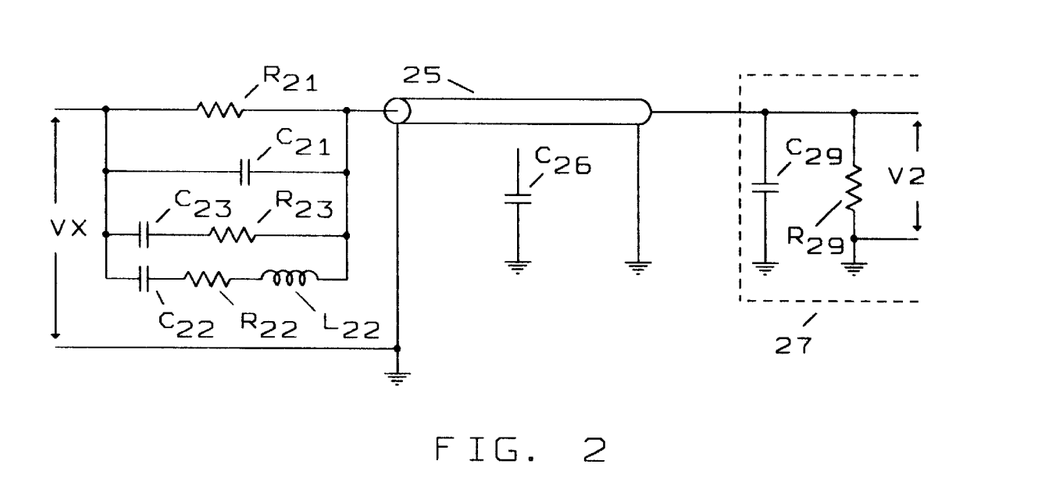
FIG. 2 shows a circuit for a high-impedance voltage probe according to the present invention.

FIG. 2 shows a schematic of a probe according to the present invention that is connected to the input of an instrument 27. The input of the Instrument again comprises a 1 megohm resistance $R_{29}$ in parallel with a small input capacitance $C_{29}$. The tip resistor $R_{21}$ forms a resistive voltage divider with the input resistance of the instrument $R_{29}$. The capacitor $C_{26}$ represents the total distributed capacitance of the transmission line 25. The subject invention uses two or more circuit paths for the AC components of a test signal to bypass the tip resistor $R_{21}$. The circuit of FIG. 2 has three such paths in the form of separate parallel circuit branches. One of these bypass paths is comprised of the capacitor $C_{21}$. A second path is comprised of capacitor $C_{23}$ and resistor $R_{23}$ connected in series. The remaining path is comprised of capacitor $C_{22}$, resistor $R_{22}$, and inductor $L_{22}$, all connected in series. For the lower frequency AC components of a test signal, the tip bypass network of FIG. 2 has an effective capacitance equal to the sum of the capacitors in these three parallel bypass branches. This capacitance forms a voltage divider with the total capacitance at the instrument input. A 10X probe requires that the sum of $C_{21}$, $C_{22}$, and $C_{23}$, must equal one ninth of the sum of $C_{29}$ and $C_{26}$. The multiple bypass paths are used to improve the high-frequency response of the probe by allowing the initial voltage at the tip end of the transmission line to approximate the ideal response described in the previous paragraph.

Of the three bypass paths in the circuit of FIG. 2, the primary path for the highest frequency AC components of the test signal is the path comprising capacitor $C_{21}$. In response to a unit step in voltage at VX, this path contributes a very snort-duration voltage spike to the initial voltage at the tip end of the transmission line. The other two bypass paths work together to generate an approximation to the previously described ideal pulse. It is instructive to consider the response of each of the three bypass paths independently (i.e., under the assumption that the other two branches are removed from the circuit). The sum of these three separate solutions does not represent a valid quantitative solution to the complete circuit because the circuit branches do not, of course, operate independently. However, this approach does give an approximate solution that is useful for understanding the circuit. These "independent solutions" are also useful in selecting component values for optimizing the circuit.

Consider the response of the circuit of FIG. 2 to a unit step in voltage at VX with the branches that include capacitors $C_{22}$ and $C_{23}$ removed from the circuit. The initial voltage at the tip end of the transmission line would be given by:

$$V(t)=e^{-t/z_0C_{21}}.$$

If time, t, is then redefined to begin when the initial voltage spike is just incident at the instrument end of the line, the input voltage V2 is given by:

$$V2(t) = \frac{2C_{21}}{C_{29} - C_{21}} [e^{-t/Z_0 C_{29}} - e^{-t/Z_0 C_{21}}].$$

These equations are similar to those presented previously for the circuit of FIG. 1, with one important difference. A relatively small value can be selected for capacitor $C_{21}$ in order to limit the initial input voltage V2. It is generally desirable to select a value for $C_{21}$ that will result in a slight overshoot in the initial value of V2(t) above the required steady-state value. Although the initial input voltage depends primarily on the value of $C_{21}$, the bypass path with capacitor $C_{23}$ also contributes to this initial voltage and this tends to minimize the required value of $C_{21}$. The small value of $C_{21}$ has the beneficial effect of minimizing the rise time of V2(t), thereby greatly improving the probe bandwidth; and it also serves to reduce the loading on the circuit under test.

Now consider the initial response of the probe from the bypass path that includes capacitor $C_{23}$ and assume that the branches that include $C_{21}$ and $C_{22}$ are removed from the circuit. The initial voltage at the tip end of the transmission line would be given by:

$$V(t) = \frac{Z_0}{Z_0 + R_{23}} e^{-t/(Z_0 + R_{23})C_{23}}.$$

This defines an initial step in voltage that decays exponentially. The initial amplitude of this step depends on the value of $R_{23}$. The fall time can be controlled by the selected value of $C_{23}$. Note that this signal can define the initial portion of a pulse that has a duration of about twice the one-way delay of the transmission line. The circuit branch with $C_{22}$ can then contribute the remaining portion of this pulse.

Assuming that the circuit branches with $C_{21}$ and $C_{23}$ are removed from the circuit, the contribution to the initial voltage at the tip end of the transmission line from the branch with $C_{22}$ is given by:

$$V(t) = \frac{Z_0 C_{22}}{\sqrt{(R_{22} + Z_0)^2 C_{22}^2 - 4L_{22}C_{22}}} [e^{-t/T_2} - e^{-t/T_1}],$$

where the time constants $T_1$ and $T_2$ are given, respectively, by:

$$T_1 = \frac{2L_{22}C_{22}}{(R_{22} + Z_0)C_{22} + \sqrt{(R_{22} + Z_0)^2 C_{22}^2 - 4L_{22}C_{22}}} \text{ and,}$$

$$T_2 = \frac{2L_{22}C_{22}}{(R_{22} + Z_0)C_{22} - \sqrt{(R_{22} + Z_0)^2 C_{22}^2 - 4L_{22}C_{22}}}.$$

These equations are for the overdamped case whereby the value of the square root is real. The equation for V(t) is a double exponential. The rise time of this signal coincides with the fall time of the signal contributed by the bypass path that includes capacitor $C_{23}$. Therefore, the contributions from these two bypass paths can combine together to give an approximation to the previously described ideal pulse. However, it may be advantageous to select component values that result in a slight underdamping for the bypass path that includes inductor $L_{22}$, as this may serve to reduce the magnitude of the signal aberrations. For the underdamped case, the approximation to the previously described ideal pulse would have a negative overshoot following the pulse fall time.

Aberrations in the signal V2(t) can be minimized by selecting component values that result in approximately equal magnitudes for the peaks and valleys of the oscillations that extend above and below the ideal voltage level. A computer simulation of the circuit, such as a SPICE simulation, can a useful tool for selecting these values. The value of capacitor $C_{21}$ is normally selected to give an initial overshoot in the input voltage V2(t), as this serves to maximize the probe bandwidth. After the initial rise time of V2(t), the input capacitor $C_{29}$ discharges back into the transmission line 25 dropping the voltage to slightly below the required value. The magnitude of this drop in voltage can be lessened by increasing the amplitude or the duration of the signal contribution from the bypass path that includes resistor $R_{23}$. The input capacitor $C_{29}$ is recharged to a value above the required voltage by the signal contribution from the bypass path that includes inductor $L_{22}$. The input capacitance $C_{29}$ then discharges back into the transmission line 25 a second time. After the arrival of the first reflection at the instrument end of the cable, capacitor $C_{29}$ is again recharged to a voltage above the required value. Multiple reflections then result in damped oscillations that settle at the required steady-state voltage.

Numerous embodiments of this invention can be devised that employ multiple circuit paths for the AC components of a test signal to bypass the tip resistor. These paths don't need to be entirely independent. For example, capacitor $C_{23}$ in the circuit of FIG. 2 Gan be eliminated if resistor $R_{23}$ is then connected instead to the node that connects capacitor $C_{22}$ and resistor $R_{22}$. Then capacitor $C_{22}$ is shared by two of the bypass paths. Also, for a probe with a short to moderate length cable, the lowest level of signal aberrations may occur when the bypass path comprised of capacitor $C_{23}$ and resistor $R_{23}$ is completely removed from the circuit.

Modifications can be made to the circuit of FIG. 2 for the purpose of reducing the level of signal aberrations. Such modifications might include the use of additional bypass paths or the use of passive delay lines—either the lumped or distributed types—in one or more of the bypass paths. The invention is also compatible with various techniques that have been used in the prior art to minimize signal aberrations. However, some of these techniques can also decrease the probe bandwidth, The circuit of FIG. 2 could, for example, be used with a lossy cable. Because the use of multiple bypass paths also contributes to a reduction in the level of signal aberrations, the resistance of the cable can be less than what is typical for the prior art. Thus even with the use of lossy cable, probe bandwidth can be increased by utilizing multiple bypass paths.

Figure 3:
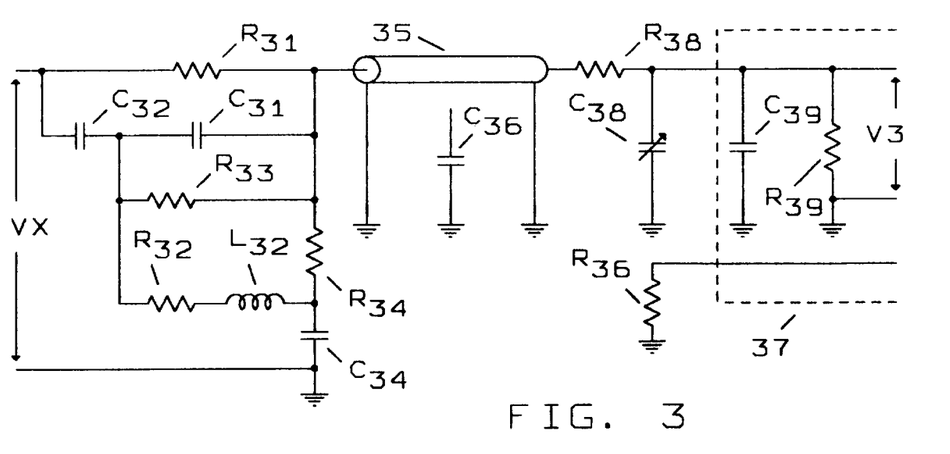
FIG. 3 shows an alternate circuit for a voltage probe according to the present invention.

FIG. 3 shows an alternate embodiment of the invention. It employs a different circuit topology for the tip bypass network and it incorporates features for reducing the magnitude of signal aberrations. The probe is connected to an instrument 37 that has an input impedance comprised of a resistor $R_{39}$ and a parallel capacitor $C_{39}$ to ground. For a standard high-impedance input, the resistor $R_{39}$ has a value of 1 megohm. The transmission line cable 35 has a distributed capacitance represented by the lumped capacitor $C_{36}$. The probe circuitry includes a variable capacitor $C_{38}$ at the instrument end of the probe that is in parallel with the input capacitance of the instrument $C_{39}$. Although an increase in the capacitance at the input to the instrument reduces the magnitude of signal aberrations, it also decreases probe bandwidth. This occurs because, in response to a step function at VX, an increased amount of charge must be delivered by the initial voltage spike from the highest frequency bypass path. This requires a higher value of capacitance in this bypass path, thereby increasing the fall time of the initial voltage spike and the corresponding rise time at the instrument input.

The variable capacitor $C_{38}$ a allows the user to adjust the attenuation of the capacitive voltage divider to match that of the resistive divider. It also allows the probe to be used with instruments that have different values of input capacitance. The probe is designed to be used with a specific value for the sum of capacitors $C_{39}$ and $C_{38}$, and to be use with instruments that have an input capacitance within a specific range of values. When the probe is used with an instrument having an input capacitance at the high end of this range, capacitor $C_{38}$ must be adjusted at or near its minimum value; and when the probe is used with an instrument that has an input capacitance at the low end of this range, $C_{38}$ must be adjusted at or near its maximum value.

Resistor $R_{38}$, which is optional, reduces the magnitude of signal aberrations. It has a value much less than that of the tip resistor $R_{31}$ or of the input resistance of the instrument $R_{39}$. This resistor $R_{38}$ increases the time constant for the input capacitance ($C_{39}$ and $C_{38}$) to discharge back into the transmission line. Although this lowers the magnitude of signal aberrations, it also lowers probe bandwidth because it requires that a larger value be used for $C_{31}$. This is necessary in order for the initial voltage spike to transfer enough charge to the input capacitance to reach the required step in the input voltage V3(t). The value of resistor $R_{38}$ also determines the magnitude and polarity of reflections from the instrument end of the cable from the very highest frequency components of incident signals. (To the very highest frequencies, the transmission line termination without the series resistor $R_{38}$ would appear as a short circuit to ground through the input capacitance). These reflections also affect the signal aberrations. If resistor R38 has the same value as the characteristic impedance of the transmission line cable, $Z_0$, then no reflections occur from the instrument end of the cable for the very highest frequency components of an incident signal.

Although not utilized in the circuit of FIG. 3, a small series resistor at the tip end of the probe could also serve to reduce signal aberrations. Such a resistor could be placed in series with capacitor $C_{31}$ (i.e., in the highest frequency bypass path), or in series with $C_{32}$ (i.e., in series with the entire bypass network), or in series with the entire tip network. However, the use of such a series tip resistor can significantly lower the probe bandwidth.

Capacitor $C_{32}$ is common to all three of the bypass paths in the probe circuit of FIG. 3. The primary path for the highest frequency components is through capacitors $C_{32}$ and $C_{31}$. Another bypass path is through $C_{32}$ and resistor $R_{33}$. The filter comprised of resistor $R_{34}$ and series capacitor $C_{34}$ serves to lower the magnitude of signal aberrations. Although this filter also tends to lower the probe bandwidth, the impact on bandwidth can be minimized by the proper selection of component values for $R_{34}$ and $C_{34}$. This requires that component values be selected that, in response to a stop function at VX, impart an initial voltage $C_{34}$ (i.e., immediately following the initial voltage spike at the tip end of the cable) that is less than about one half of the final voltage on the probe. This filter is integrated with the lower frequency bypass path. Instead of being directly connected to the tip end of the cable, inductor $L_{32}$ is connected to the filter capacitor $C_{34}$. This also serves to reduce the level of signal aberrations. Thus the bypass path for the lower frequency AC components is through capacitor $C_{32}$, resistor $R_{32}$, inductor $L_{32}$, and resistor $R_{34}$.

A number of modifications can be made to the probe circuit of FIG. 3. For example, instead of being connected directly to capacitor $C_{32}$, the tip end of resistor $R_{33}$ can be connected to the node connecting resistor $R_{32}$ and inductor $L_{32}$. If capacitor $C_{38}$ is removed from the circuit, or if it is replaced with a fixed capacitor, then a variable capacitor can be used for $C_{32}$ in order to provide the adjustment for frequency compensation. Capacitor $C_{31}$ can be connected directly across the tip resistor $R_{31}$ instead of being connected in series with $C_{32}$. However, the series connection may be preferable if a variable—rather than fixed-capacitor is used for $C_{31}$. Using a variable capacitor for $C_{31}$ gives the user control over the initial rise time and overshoot in response to a step in voltage. Then with $C_{31}$ connected in series with $C_{32}$, the adjustment for rise time (via $C_{31}$) and the adjustment for frequency compensation (via $C_{38}$ or via $C_{32}$) are relatively independent (e.,g an adjustment in the value of $C_{31}$ should not require a readjustment of $C_{38}$). The rise time adjustment can be especially useful for probes that are used with different instruments. This is because the initial overshoot is attenuated within an instrument by an amount that depends on the bandwidth of the instrument.

Figure 4:
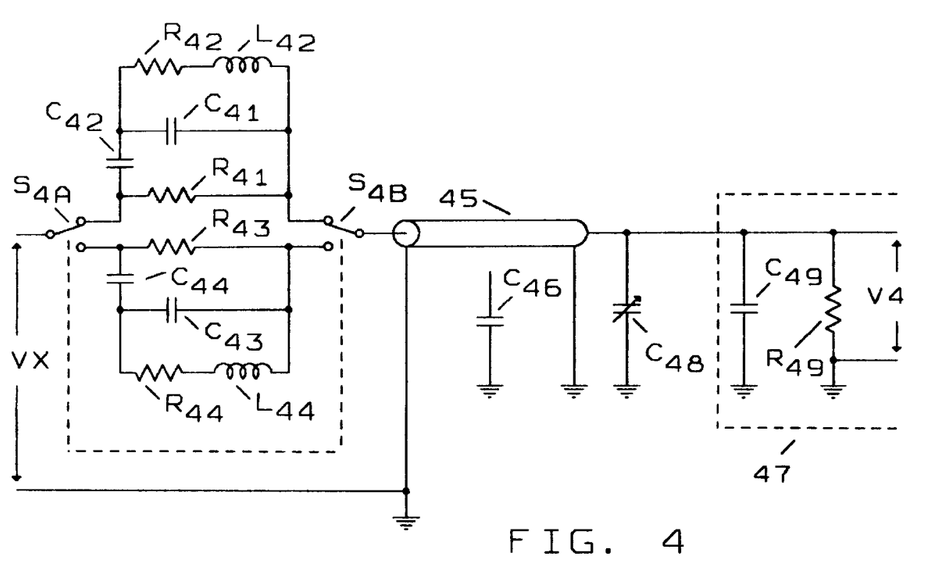
FIG. 4 shows a schematic of a probe that incorporates two selectable attenuation factors.

Various probe features that are used in the prior art, are also compatible with the present invention. For example, some probes incorporate a coded signal to the instrument that designates the attenuation factor of the probe. This allows the instrument to provide read-outs of true signal voltages. One technique for implementing this feature, as shown in FIG. 3, is to incorporate a resistor $R_{36}$ that has one terminal grounded within the probe and the other connected to the instrument. The value of this resistor, which can be determined by the instrument, can be selected to code for the attenuation of the probe. This same coded signal can also be used to identify other probe characteristics. For example, coding for the probe time delay would allow an instrument to correct the timing skew resulting from the use of two probes having different delays. Some probes also incorporate a momentary switch within the probe tip to help the user identify which displayed signal-trace belongs to that specific probe. When activated, this switch can be designed to change the probe attenuation (as shown in FIG. 4) or to ground the input to the instrument. This can momentarily alter the traced signal, thereby allowing the user to identify which signal-trace is associated with the probe.

An alternate mechanism for implementing the signal-trace identity feature, is to include a dedicated signal from the probe to the instrument for this purpose. This signal can be grounded by a switch in the probe tip in order to activate the trace identity function. The instrument can be designed to monitor this input, and to alter the display screen—so as to identify the signal-trace for that probe—whenever the switch is closed. For example, the signal-trace could be made to blink on-and-off.

Some probes include a 2-position switch within the probe tip to select an attenuation of either 10X or 1X (see U.S. pat. No. 3,412,327, Murray). If employed with the probe circuit of FIG. 3, this switch could be in the open position for an attenuation of 10X, thereby having no effect on the probe circuit. For an attenuation of 1X, the switch could be closed in order to short out the tip resistor $R_{31}$, thereby essentially connecting the test signal directly to the instrument. Alternately, the 1X position might connect a small resistance in parallel with resistor $R_{31}$ (instead of sorting out $R_{31}$) so as to reduce the level of signal aberrations in the 1X mode. If a probe with a switchable attenuation has a coded signal to the instrument to designate the attenuation factor of the probe, the switch that selects the attenuation must also modify the coded signal to the instrument in order to correctly identify the attenuation level. With the switch at the tip end of the probe, this requires at least one additional conductor for this purpose in the probe cable. Some switchable 10X/1X probes employ a 3-position switch whereby the additional switch position is used to ground the tip end of the probe cable. This switch position, denoted as the "reference position", allows the user to adjust the DC offset position of the trace on the display screen for an input of 0 volts.

The majority of high-impedance passive probes have an attenuation of 10X (i.e., 10:1). However, higher attenuation factors yield both higher probe bandwidth and lower input capacitance. in fact, were it not for parasitic effects (such as stray capacitance to ground at the probe tip), bandwidth would be a linear function of the attenuation factor. For example, a probe with an attenuation of 20X would have twice the bandwidth of a similarly designed probe with an attenuation of 10X. But because of the parasitic effects, a 20X probe will have somewhat less than twice the bandwidth of a 10X probe.

The vertical scale factors available for oscilloscopes (i.e., per division of the display screen) generally employ a 1:2:5 sequence. For example, an oscilloscope might have fixed scale factors of: 0.001 volts; 0.002 volts; 0.005 volts; 0.01 volts; 0.02 volts; 0.05 volts; 0.1 volts; 0.2 volts; 0.5 volts; 1.0 volts; 2.0 volts; and 5.0 volts. Probes with a 10X attenuation factor are convenient to use with prior-art instrumentation because the user is required to manually compensate the vertical sensitivity selected on the instrument by the attenuation of the probe. However, modern instruments generally have digital read-outs of true voltage that incorporate any attenuation due to the voltage probe. With this capability in the instrument, it is less important. that a "simple number", such as 10, be used for probe attenuation. The instrument can be designed to accommodate probes having other attenuation factors. Therefore, it is practical to use probes with higher attenuation factors, such as 20X or 30X, in order to realize the much high or bandwidths that are available with such probes.

Because higher attenuation factors increase bandwidth and lower input capacitance, it can be advantageous to use a probe with an attenuation factor significantly higher than 10X with an instrument that was not specifically designed for such an attenuation factor However, this would be inconvenient to the user if it results in a nonstandard scale factor on the display screen of the instrument. A probe with switchable attenuation factors of 20X and 25X would allow the user to maintain the vertical scaling sequence of 1:2:5 by switching the probe between these two attenuation factors in accordance with the input sensitivity that is selected on the instrument. Switchable probe attenuation factors of 40X and 50X would also allow this capability. For example, a 20X probe with an oscilloscope sensitivity of 0.1 volts per display division results in an effective sensitivity of 2 volts per division. If the oscilloscope sensitivity is changed to 0.2 volts per division, the probe can be switched to an attenuation of 25X in order to give an actual sensitivity of 5 volts per division. Increasing the oscilloscope sensitivity to 0.5 volts and switching the probe back to 20X attenuation gives an actual sensitivity of 10 volts per division. In this manner, the user can maintain the 1:2:5 sequence of vertical sensitivity. Of course, an attenuation of 100X also maintains the 1:2:5 sequence of vertical sensitivity. However, this level of attenuation can be too high for some low amplitude signals. Therefore, a probe with switchable attenuation factors of 10X and 100X could also prove useful. A probe with two selectable attenuation levels can be implemented by including two separate circuit networks in the probe tip-one for each attenuation factor. A switch can be used to connect one or the other of these networks between the probe tip and the tip end of the probe cable.

FIG. 4 shows the schematic of a voltage probe that has two switchable attenuation level. It incorporates a 2-position DPDT switch, shown as $S_{4A}$ and $S_{4B}$, that selects the probe attenuation by connecting one of two circuit networks between the probe tip and the probe cable. The probe is shown connected to an instrument input 47 that has a resistance to ground $R_{49}$ with a parallel 4 input capacitance $C_{49}$. The probe incorporates a variable capacitor $C_{48}$ at the instrument end for adjusting the frequency compensation. Capacitor $C_{46}$ represents the distributed capacitance of the probe cable 45. The input signal to the instrument V4 approximates an attenuated replica of the signal under test VX, with the attenuation factor dependent on the position of the probe switch $S_{4A}/S_{4B}$. In the switch position shown, resistor $R_{41}$ is connected between the probe tip and the cable. This tip resistor determines the DC attenuation level of the probe. It is bypassed by two circuit paths for AC components of the test signal. The bypass path for the highest frequency components is through capacitors C42 and $C_{41}$. The path for lower frequency AC components is through capacitor $C_{42}$, resistor $R_{42}$, and inductor $L_{42}$. For the alternate switch position, $R_{43}$ serves as the tip resistor and it determines the DC attenuation of the probe. It is bypassed by $C_{44}$ and $C_{43}$ for the higher frequency components, and by $C_{44}$, $R_{44}$, and $L_{44}$ for the lower frequency AC components.

Probes with selectable attenuation factors, as just described, do not require the use of multiple bypass paths in the probe tip circuitry, as per this invention disclosure. Such probes could also be of benefit if implemented with probe circuitry that is otherwise consistent with the prior art. The benefits of higher bandwidth and lower input capacitance, that are inherent with higher attenuation levels, also apply to prior-art probe circuitry. Low-impedance probe types and active probe types could also be designed to accommodate these multiple attenuation factors. Probes can also be designed to accommodate multiple attenuation factors without the use of a switch. An alternate approach is to employ replaceable probe tips that incorporate the attenuating circuitry. Probe tips with different attenuation factors can then be used with the same probe body. This alternate approach can be employed with either the high-impedance or the low-impedance passive probe types.

Logic analyzers may employ multi-conductor cables for connecting multiple signals to the instrument. They generally include a circuit network between each test signal connection and each corresponding cable connection. The purpose of these circuit networks, which could be either active or passive, is to present a relatively high impedance to each of the signals being tested. For systems that employ a passive network, the input impedance at the instrument may be equivalent to a resistance to ground with a parallel capacitance. The value of this input resistance may be different than the 1 megohm value that is standard for the high-impedance inputs of oscilloscopes. The passive circuit network at the tip might then comprise a series tip resistor with a parallel bypass capacitor. In order to minimize the signal aberrations at the instrument input, the multi-conductor cable could employ resistive signal lines. However, the use of multiple bypass paths, as described by the present invention, can reduce signal aberrations to an acceptable level without requiring the use of resistive signal lines.

A higher level of signal aberrations may be acceptable for logic analyzer applications than for oscilloscope applications. Therefore, a simpler circuit than the one shown in FIG. 3 could be employed. For example, a user accessible adjustment for frequency compensation, via a variable capacitor, would not be included. Also, the tip bypass circuit of FIG. 3 might be simplified by eliminating the inductor $L_{32}$, in which case resistor $R_{32}$ would be connected directly to the node connecting resistor $R_{34}$ and capacitor $C_{34}$. Resistor $R_{33}$ might also be removed from the circuit. A tip bypass network similar to that shown in FIG. 2 could also be employed. Also, for logic analyzer applications, the instrument end of the probe cable would most likely be connected directly to the instrument input. If a series terminating resistor is used, as resistor $R_{38}$ of FIG. 3, it can be located in the instrument rather than in the probe.

The priority in the tradeoff between probe bandwidth and the magnitude of signal aberrations depends on the specific application. Therefore, different probe circuitry—including the tip bypass circuitry—might be employed for different applications. As noted, the logic analyzer application may be more tolerant of signal aberrations than the oscilloscope application. A spectrum analyzer, however, may require a very low level of signal aberrations. In addition to its use with such general purpose instrumentation, the invention can also be employed with dedicated or customized equipment. For example, it might be used with a wafer prober for the testing of integrated circuits during the manufacturing process.

It should be understood that many other embodiments of the present invention will be apparent to those skilled in the art. The, following claims should be interpreted as covering all embodiments that fall within the true spirit and scope of the invention.

I claim:

1. A voltage probe comprising:

a transmission line comprising a signal conductor and a return conductor;

a first connection means for making an electrical circuit connection between a first end of said transmission line and a signal under test, said first connection means comprising a network of passive circuit components connected in series between said signal under test and said signal conductor at said first end of said transmission line;

a second connection means for making an electrical circuit connection between a second end of said transmission line and a signal input to an electronic apparatus, the signal input being an attenuated signal that otherwise approximates said signal under test;

an attenuating resistance within said network of passive circuit components that attenuates the level of the direct current component of said signal under test at said signal conductor at said first end of said transmission line;

a first response means for responding to a step in voltage by said signal under test with an initial response at said signal conductor at said first end of said transmission line that comprises a voltage spike that is substantially more narrow than the delay time of said transmission line wherein said voltage spike delivers a charge to said second end of said transmission line that results in an initial voltage at said signal input to an electronic apparatus that approximates the steady-state voltage that results from said step in voltage by said signal under test;

a second response moans for responding to said step in voltage by said signal under test with an initial response at said signal conductor at said first end of said transmission line that comprises a voltage pulse that is superimposed with said voltage spike, said voltage pulse roughly approximating a pulse having a time duration of about twice the delay time of the transmission line and an amplitude of about one half of the steady-state voltage response of said transmission line to said step in voltage by said signal under test; and a plurality of circuit paths through said network of passive circuit components that bypass at least a part of said attenuating resistance and that pass alternating current while blocking the passage of direct current, wherein said first response means and said second response means comprise said plurality of circuit paths.

2. The voltage probe of claim 1 wherein at least one of said plurality of circuit paths includes a series inductance.

3. The voltage probe of claim 1 wherein said network of passive circuit components further comprises a variable capacitance means for adjusting the initial rise time and overshoot of said signal input to an electronic apparatus in response to said step in voltage by said signal under test.

4. The voltage probe of claim 1 wherein said at least a part of said attenuating resistance comprises at least ninety percent of the total value of said attenuating resistance.

5. The voltage probe of claim 1 wherein the total series resistance through at least one of said plurality of circuit paths is less than four times the characteristic impedance of said transmission line.

6. The voltage probe of claim 1 wherein said plurality of circuit paths comprises at least three circuit paths.

7. The voltage probe of claim 1, further comprising:

a resistive voltage divider that attenuates the direct current component of said signal input to an electronic apparatus relative to the direct current component of said signal under test;

a series resistance between said signal under test and said signal input to an electronic apparatus wherein said series resistance is part of said resistive voltage divider and includes said attenuating resistance;

an input resistance that is part of said resistive voltage divider and is the effective resistance for all paths of direct current between said signal input to an electronic apparatus and said return conductor; and a capacitive voltage divider that attenuates lower frequency alternating current components of said signal input to an electronic apparatus relative to the lower frequency alternating current components of said signal under test wherein the level of attenuation of said capacitive voltage divider approximates the level of attenuation of said resistive voltage divider.

8. The voltage probe of claim 7 wherein said voltage probe is one of a plurality of substantially similar voltage probes that are part of a system that simultaneously connects a plurality of signals to at least one electronic apparatus.

9. The voltage probe of claim 7 wherein the paths of direct current between said signal input to an electronic apparatus and said return conductor that constitute said input resistance are located only at said second end of said transmission line and within the connected electronic apparatus.

10. A voltage probe comprising:

a transmission line comprising a signal conductor and a return conductor;

a first connection means for making an electrical circuit connection between a first end of said transmission line and a signal under test, said first connection means comprising a network of passive circuit components connected in series between said signal under test and said signal conductor at said first end of said transmission line;

a second connection means for making an electrical circuit connection between a second end of said transmission line and a signal input to an electronic apparatus, the signal input being an attenuated signal that otherwise approximates said signal under test;

an attenuating resistance within said network of passive circuit components that attenuates the level of the direct current component of said signal under test at said signal conductor at said first end of said transmission line; and a plurality of circuit paths through said network of passive circuit components that bypass at least a part of said attenuating resistance and that pass alternating current while blocking the passage of direct current.

11. The voltage probe of claim 10 wherein at least one of said plurality of circuit paths includes a series inductor and wherein at least one of said plurality of circuit paths is devoid of series inductors.

12. The voltage probe of claim 11, further comprising a response means for responding to a step in voltage by said signal under test with an initial response at said signal conductor at said first end of said transmission line that comprises:

a voltage spike that is substantially more narrow than the delay time of the transmission line wherein at least one of said plurality of circuit paths contributes said voltage spike to said initial response and wherein said voltage spike delivers a charge to said second end of said transmission line that results in an initial voltage at said signal input to an electronic apparatus that approximates the steady-state voltage response that results from said step in voltage by said signal under test, and a superimposed voltage pulse that roughly approximates a pulse having a time duration of about twice the delay time of the transmission line and an amplitude of about one half the steady-state voltage response of the transmission line wherein at least one of said plurality of circuit paths contributes said voltage pulse to said initial response.

13. The voltage probe of claim 12 wherein said network of passive circuit components further comprises a variable capacitance means for adjusting the initial rise time and overshoot of said signal input to an electronic apparatus in response to said step in voltage by said signal under test.

14. The voltage probe of claim 12 wherein said at least a part of said attenuating resistance comprises at least ninety-nine percent of the total value of said attenuating resistance.

15. The voltage probe of claim 12 wherein the total series resistance through at least one of said plurality of circuit paths is less than twice the characteristic impedance of said transmission line.

16. The voltage probe of claim 12 wherein said voltage probe is one of a plurality of substantially similar voltage probes that are part of a system that simultaneously connects a plurality of signals to at least one electronic apparatus.

17. The voltage probe of claim 12, further comprising:

a resistive voltage divider that attenuates the direct current component of said signal input to an electronic apparatus relative to the direct current component of said signal under test;

a series resistance between said signal under test and said signal input to an electronic apparatus wherein said series resistance is part of said resistive voltage divider and includes said attenuating resistance;

an input resistance that is part of said resistive voltage divider and is the effective resistance for all paths of direct current between said signal input to an electronic apparatus and said return conductor;

a capacitive voltage divider that attenuates lower frequency alternating current components of said signal input to an electronic apparatus relative to the lower frequency alternating current components of said signal under test; and an adjustment means for adjusting the level of attenuation of said capacitive voltage divider to approximately match the level of the attenuation of said resistive voltage divider.

18. The voltage probe of claim 17 wherein the paths of direct current between said signal input to an electronic apparatus and said return conductor that constitute said input resistance are located only at said second end of said transmission line and within the connected electronic apparatus.

19. The voltage probe of claim 17, further comprising:

at least one available attenuation factor that is approximately equal to the voltage level of said signal under test divided by the voltage level of said signal input to an electronic apparatus, and an identification means for identifying a set of voltage probe characteristics to the connected electronic apparatus wherein said set of voltage probe characteristics comprises at least the attenuation factor.

20. A voltage probe comprising:

a transmission line cable comprising a signal conductor and a return conductor;

a first connection means for making an electrical circuit connection between a first end of said transmission line cable and a signal under test, said first connection means comprising a network of passive circuit components connected in series between said signal under test and said signal conductor at said first end of said transmission line cable;

a second connection means for making an electrical circuit connection between a second end of said transmission line cable and a signal input to an electronic apparatus, the signal input being an attenuated signal that otherwise approximates said signal under test; and a means for selecting one of a plurality of available attenuation factors wherein the attenuation factor is approximately equal to the voltage level of said signal under test divided by the voltage level of said signal input to an electronic apparatus, and wherein said plurality of available attenuation factors includes at least one set of attenuation factors selected from the group consisting of the set of attenuation factors 20X and 25X, and the set of attenuation factors 40X and 50X.

* * * * *